US012785029B2

(12) United States Patent
Nishitani

(10) Patent No.: US 12,785,029 B2
(45) Date of Patent: Nov. 3, 2026

(54) ELECTRON GUN, ELECTRON BEAM APPLICATOR, AND IRRADIATION POSITION MOVING METHOD

(71) Applicant: Photo electron Soul, Inc., Nagoya (JP)

(72) Inventor: Tomohiro Nishitani, Nagoya (JP)

(73) Assignee: Photo electron Soul Inc., Nagoya (JP)

( * ) Notice: Subject to any disclaimer, the term of this patent is extended or adjusted under 35 U.S.C. 154(b) by 294 days.

(21) Appl. No.: 18/556,076

(22) PCT Filed: Mar. 25, 2022

(86) PCT No.: PCT/JP2022/014225
§ 371 (c)(1),
(2) Date: Oct. 18, 2023

(87) PCT Pub. No.: WO2022/230488
PCT Pub. Date: Nov. 3, 2022

(65) Prior Publication Data
US 2024/0222062 A1 Jul. 4, 2024

(30) Foreign Application Priority Data
Apr. 26, 2021 (JP) ................................ 2021-074108

(51) Int. Cl.
*H01J 37/147* (2006.01)
*H01J 1/34* (2006.01)
*H01J 37/073* (2006.01)

(52) U.S. Cl.
CPC ............ *H01J 37/1471* (2013.01); *H01J 1/34* (2013.01); *H01J 37/073* (2013.01); *H01J 2201/3423* (2013.01); *H01J 2237/0203* (2013.01)

(58) Field of Classification Search
CPC ................. H01J 37/1474; H01J 37/073; H01J 2237/0203; H01J 1/34; H01J 2201/3423
See application file for complete search history.

(56) References Cited

U.S. PATENT DOCUMENTS

2016/0301180 A1 10/2016 Nikipelov et al.
2020/0294760 A1 9/2020 Wang et al.
(Continued)

FOREIGN PATENT DOCUMENTS

JP H10-334842 A 12/1998
JP 2000-223052 A 8/2000
(Continued)

OTHER PUBLICATIONS

Korea Office Action, dated Feb. 7, 2025 for corresponding Korean Application No. 10-2023-7034312 with English translation (total 13 pages).
(Continued)

*Primary Examiner* — Georgia Y Epps
*Assistant Examiner* — Hanway Chang
(74) *Attorney, Agent, or Firm* — INTELLECTUAL PROPERTY LAW GROUP LLP

(57) ABSTRACT

Provided are an electron gun that can extend the lifetime of a photocathode, an electron beam applicator on which the electron gun is mounted, and an irradiation position moving method. This object can be achieved by an electron gun including: a light source; a photocathode that emits an electron beam in response to receiving light from the light source; an anode; a motion device that moves excitation light irradiating the photocathode; and a control unit, the control unit controls the motion device to move an irradiation position of the excitation light from a position $R_n$ (n is a natural number) on the photocathode to a position $R_{n+1}$ outside an excitation light irradiation-caused deteriorated range associated with the position $R_n$, the excitation light irradiation-caused deteriorated range is a range where the photocathode is deteriorated due to irradiation with the excitation light, and the distance between the center of a spot of the excitation light at the position $R_n$ and the center of a (Continued)

spot of the excitation light at the position $R_{n+1}$ is at least three or more times a spot diameter of the excitation light on the photocathode.

19 Claims, 4 Drawing Sheets

(56) References Cited

U.S. PATENT DOCUMENTS

| | | | |
|---|---|---|---|
| 2021/0375578 | A1 | 12/2021 | Watanabe et al. |
| 2022/0181111 | A1 | 6/2022 | Shikano et al. |
| 2023/0131413 | A1 | 4/2023 | Koizumi et al. |

FOREIGN PATENT DOCUMENTS

| | | | | | |
|---|---|---|---|---|---|
| JP | 2002-500809 | A | | 1/2002 | |
| JP | 2002-313273 | A | | 10/2002 | |
| JP | 3537779 | B2 | | 3/2004 | |
| JP | 2017-126432 | A | | 7/2017 | |
| JP | 2018-181403 | A | | 11/2018 | |
| JP | 6578529 | B1 | | 9/2019 | |
| JP | 6679014 | B1 | | 3/2020 | |
| KR | 10-2016-0095094 | A | | 8/2016 | |
| TW | 202046365 | A | | 12/2020 | |
| WO | WO 98/54750 | | | 12/1998 | |
| WO | WO 2015/082295 | A1 | | 6/2015 | |
| WO | WO 2019/221119 | A1 | | 11/2019 | |
| WO | WO-2021192070 | A1 | * | 9/2021 | ................ H01J 1/34 |

OTHER PUBLICATIONS

International Search Report, dated May 17, 2022 for corresponding International Application No. PCT/JP2022/014225 with English translation (5 pages).

Written Opinion of the ISA, dated May 17, 2022 for corresponding International Application No. PCT/JP2022/014225 with English summary translation (6 pages).

Daiki Sato et al., "Observation of relaxation time of surface charge limit for InGaN photocathodes with negative electron affinity", Jpn. J. Appl. Phys. 55, 05FH05, 2016, pp. 1-4 (5 pages).

Extended European Search Report, dated Jul. 26, 2024 for corresponding European Application No. 22795406.2 (total 9 pages).

Taiwan Office Action, dated Sep. 2, 2025, for corresponding Taiwan Application No. 111114168 with English translation (6 pages).

China Office Action issued by CNIPA, dated Jul. 8, 2026, for the corresponding Chinese Application No. 202280027915.4 (total 14 pages).

* cited by examiner

ELECTRON GUN, ELECTRON BEAM APPLICATOR, AND IRRADIATION POSITION MOVING METHOD

CROSS-REFERENCE TO RELATED APPLICATIONS

This application is a U.S. National Phase application, under 35 U.S.C. § 371, of International Application no. PCT/JP2022/014225, with an international filing date of Mar. 25, 2022, and claims priority to Japanese application no. 2021-074108 filed on Apr. 26, 2021, each of which is hereby incorporated by reference for all purposes.

TECHNICAL FIELD

The disclosure in the present application relates to an electron gun, an electron beam applicator, and an irradiation position moving method.

BACKGROUND ART

An electron gun equipped with a photocathode, electron beam applicators such as an electron microscope, a free electron laser accelerator, an inspection device, or the like including the electron gun (hereafter, a device which is an electron beam applicator excluding an electron gun therefrom may be referred to as a "counterpart device") are known. For example, Patent Literature 1 discloses an electron microscope device with a photocathode that emits an electron beam in response to being irradiated with excitation light from a light source.

In electron beam applicators such as an electron microscope device, it is required to stably maintain emission of an electron beam. In a photocathode, however, continued excitation light irradiation causes deterioration of electron emission characteristics and a decrease in the number of emitted electrons. Thus, in an electron beam source with such a photocathode, the intensity of an electron beam decreases over operation time. Thus, Patent Literature 1 discloses increasing the intensity of excitation light or applying deposition of Cs to recover the intensity of the electron beam. Further, Patent Literature 2 discloses providing a unit configured to move a photocathode inside a vacuum chamber and moving the photocathode to prevent deterioration of an electron beam source due to irradiation with excitation light.

CITATION LIST

Patent Literature

Patent Literature 1: Japanese Patent Application Laid-Open No. 2002-313273

Patent Literature 2: Japanese Patent Application Laid-Open No. 2000-223052

SUMMARY OF INVENTION

Technical Problem

While Patent Literature 1 and Patent Literature 2 intend to stably maintain emission of an electron beam, the methods thereof differ from each other. Patent Literature 1 discloses applying redeposition of Cs to recover the intensity of an electron beam when the photocathode is deteriorated. Patent Literature 2 discloses providing a unit configured to move the photocathode in the orthogonal direction relative to the optical axis of the excitation light to rotate/move linearly the photocathode (hereafter, also referred to as "photocathode position adjustment unit") inside a vacuum chamber so that a location which has not been exposed to excitation light is irradiated with the excitation light.

In Patent Literature 2, since the position on the photocathode to be irradiated with excitation light is set to a position which has not been exposed to the excitation light as described above, it is possible to not only stably maintain emission of an electron beam but also extend the lifetime of the photocathode. It is thus possible to reduce the frequency of redeposition of Cs and improve the operation rate of an electron beam applicator on which an electron gun is mounted.

However, since the electron gun disclosed in Patent Literature 2 has a photocathode position adjustment unit, there is a problem of increased size of the device. Furthermore, the photocathode position adjustment unit is arranged inside the vacuum chamber. Thus, when the photocathode position adjustment unit fails, it is required to control the pressure inside the vacuum chamber back to the atmospheric pressure and repair the photocathode position adjustment unit, and complex operations such as evacuating the vacuum chamber are required before using the electron gun again.

The present inventors have made an intensive study and newly found that it is possible to extend the lifetime of a photocathode without using such a photocathode position adjustment unit.

Accordingly, an object of the disclosure of the present application is to provide an electron gun that can extend the lifetime of a photocathode, an electron beam applicator on which the electron gun is mounted, and an irradiation position moving method. Other optional, additional advantageous effects of the disclosure in the present application will be apparent in embodiments of the invention.

Solution to Problem (1) An electron gun comprising:

a light source;

a photocathode that emits an electron beam in response to receiving light from the light source;

an anode;

a motion device that moves excitation light irradiating the photocathode; and a control unit, wherein the control unit controls the motion device to move an irradiation position of the excitation light from a position $R_n$ (n is a natural number) on the photocathode to a position $R_{n+1}$ outside an excitation light irradiation-caused deteriorated range associated with the position $R_n$, wherein the excitation light irradiation-caused deteriorated range is a range where the photocathode is deteriorated due to irradiation with the excitation light, and wherein the distance between the center of a spot of the excitation light at the position $R_n$ and the center of a spot of the excitation light at the position $R_{n+1}$ is at least three or more times a spot diameter of the excitation light on the photocathode.

(2) The electron gun according to (1) above further comprising a calculation unit that calculates quantum efficiency of the photocathode at an irradiation position of the excitation light, wherein the control unit controls the motion device based on a calculation result from the calculation unit.

(3) The electron gun according to (1) or (2) above, wherein the position $R_{n+1}$ is a position outside the excitation light irradiation-caused deteriorated range a position irradiated with the associated with excitation light before irradiation of the position $R_n$.

(4) The electron gun according to (1) or (2) above, wherein the position $R_{n+1}$ is a position included in the excitation light irradiation-caused deteriorated range associated with a position irradiated with the excitation light before irradiation of the position $R_n$.

(5) The electron gun according to (1) to (4) above further comprising a photocathode holder, wherein the photocathode holder holds the photocathode, and includes a lens arranged spaced apart from the photocathode and configured to converge light from the light source onto the photocathode.

(6) An electron beam applicator including the electron gun according to any one of (1) to (5) above, wherein the electron beam applicator is:

a free electron laser accelerator,
an electron microscope,
an electron holography device,
an electron beam drawing device,
an electron diffractometer,
an electron beam inspection device,
an electron beam metal additive manufacturing device,
an electron beam lithography device,
an electron beam processing device,
an electron beam curing device,
an electron beam sterilization device,
an electron beam disinfection device,
a plasma generation device,
an atomic element generation device,
a spin-polarized electron beam generation device,
a cathodoluminescence device, or
an inverse photoemission spectroscopy device.

(7) An irradiation position moving method for moving an irradiation position of excitation light irradiating a photocathode in an electron gun including a light source and the photocathode, the irradiation position moving method comprising:

an irradiation step of irradiating a position $R_n$ (n is a natural number) on the photocathode with the excitation light; and a motion step of moving an irradiation position of the excitation light from the position $R_n$ to a position $R_{n+1}$ outside an excitation light irradiation-caused deteriorated range associated with the position $R_n$, wherein the excitation light irradiation-caused deteriorated range is a range where the photocathode is deteriorated due to irradiation with the excitation light, and wherein the distance between the center of a spot of the excitation light at the position $R_n$ and the center of a spot of the excitation light at the position $R_{n+1}$ is at least three or more times a spot diameter of the excitation light on the photocathode.

(8) The irradiation position moving method according to (7) above further comprising a calculation step of calculating quantum efficiency of the photocathode at an irradiation position of the excitation light between the irradiation step and the motion step, wherein the motion step is performed based on a calculation result provided by the calculation step.

(9) The irradiation position moving method according to (7) or (8) above, wherein in the motion step, the position $R_{n+1}$ is a position outside the excitation light irradiation-caused deteriorated range associated with a position irradiated with the excitation light before irradiation of the position $R_n$.

(10) The irradiation position moving method according to (7) or (8), wherein in the motion step, the position $R_{n+1}$ is a position included in the excitation light irradiation-caused deteriorated range associated with a position irradiated with the excitation light before irradiation of the position $R_n$.

Advantageous Effect

The electron gun disclosed in the present application can extend the lifetime of a photocathode without using any photocathode position adjustment unit. Further, since there is no photocathode position adjustment unit arranged inside the vacuum chamber, the size of the electron gun can be reduced, and there is no longer a risk of a failure which would otherwise be caused by the photocathode position adjustment unit.

DETAILED DESCRIPTION OF EMBODIMENTS

Figure 1:
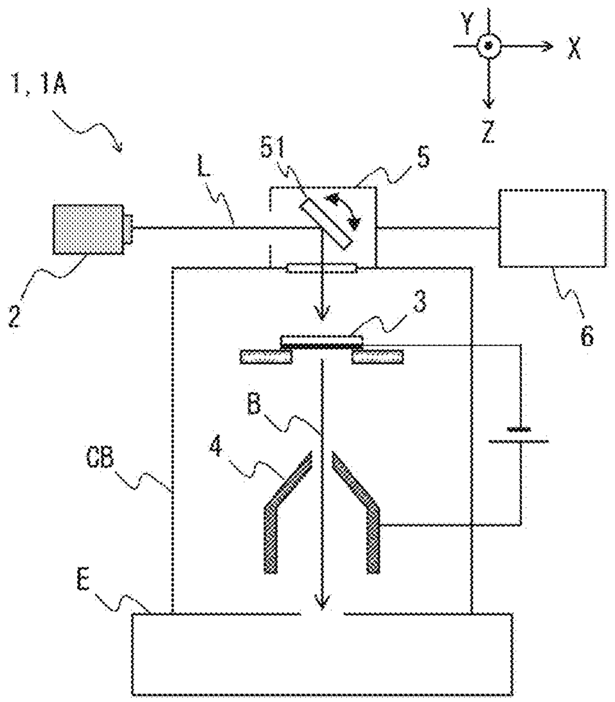
FIG. 1 is a diagram schematically illustrating an example of an electron gun 1A according to a first embodiment when viewed from the Y direction.

An electron gun, an electron beam applicator, and an irradiation position moving method will be described below in detail with reference to the drawings. Note that, in the present specification, members having the same type of functions are labeled with the same or similar references. Further, duplicated description for the members labeled with the same or similar references may be omitted.

Further, the position, size, range, or the like of respective components illustrated in the drawings may be depicted differently from the actual position, size, range, or the like for easier understanding. Thus, the disclosure in the present application is not necessarily limited to the position, size, range, or the like disclosed in the drawings.

Definition of Direction

In the present application, in a three-dimensional orthogonal coordinate system with an X-axis, a Y-axis, and a Z-axis, a direction in which an electron beam emitted from a photocathode travels is defined as the Z direction. Note that, although the Z direction is the perpendicularly downward direction, for example, the Z direction is not limited to the perpendicularly downward direction.

First Embodiment of Electron Gun

Figure 2A:
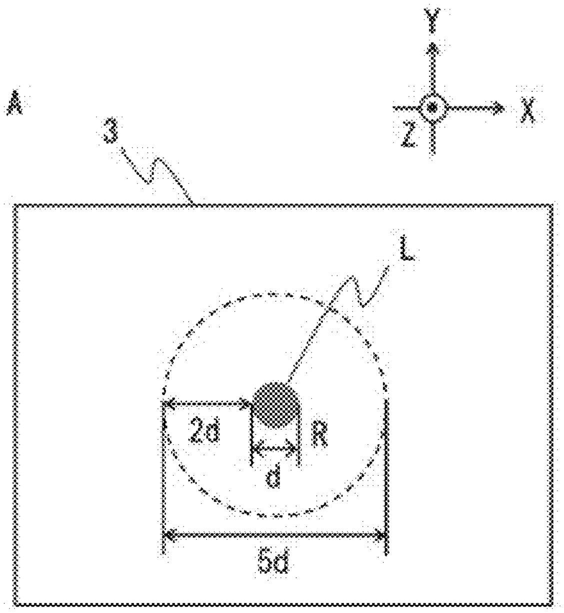
FIG. 2A is a diagram schematically illustrating a photocathode 3 irradiated with excitation light L at a position R.
Figure 2B:
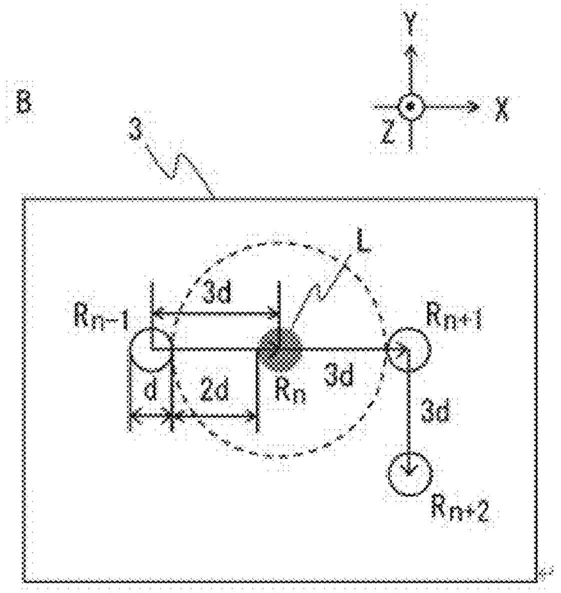
FIG. 2B is a diagram schematically illustrating a process of moving an irradiation position of the excitation light L on the photocathode 3.

An electron gun 1A according to the first embodiment will be described with reference to FIG. 1 and FIG. 2. FIG. 1 is a diagram schematically illustrating an example of the electron gun 1A according to the first embodiment when viewed from the Y direction. FIG. 2A is a diagram schematically illustrating a photocathode 3 irradiated with excitation light L at a position R. FIG. 2B is a diagram schematically illustrating the position irradiated with the excitation light L in accordance with motion of the irradiation position of the excitation light L.

The electron gun 1A according to the first embodiment includes at least a light source 2, the photocathode 3, an anode 4, a motion device 5, and a control unit 6.

The light source 2 is not particularly limited as long as it can irradiate the photocathode 3 with the excitation light L to cause emission of an electron beam B. The light source 2 may be, for example, a high power (watt class), high frequency (several hundred MHz), ultrashort pulse laser light source, a relatively inexpensive laser diode, an LED, or the like. The excitation light L for irradiation can be either pulsed light or continuous light and can be adjusted as appropriate in accordance with purposes. In the example illustrated in FIG. 1, the light source 2 is arranged outside a vacuum chamber CB. Alternatively, the light source 2 may be arranged inside the vacuum chamber CB.

The photocathode 3 emits an electron beam B in response to receiving the excitation light L emitted from the light source 2. More specifically, electrons in the photocathode 3 are excited by the excitation light L, and the excited electrons are emitted from the photocathode 3. The emitted electrons are accelerated by an electric field generated by the anode 4 and the cathode (including the photocathode 3) to form the electron beam B. Although the backside of the photocathode 3 is irradiated with the excitation light L in the example illustrated in FIG. 1, alternatively, the front side of the photocathode 3 may be irradiated with the excitation light L.

The photocathode 3 is formed of a substrate of quartz glass, sapphire glass, or the like and a photocathode film adhered to a first face (a face on the anode 4 side) of the substrate. The photocathode material for forming the photocathode film is not particularly limited as long as it can emit the electron beam B by being irradiated with excitation light and may be a material requiring EA surface treatment, a material not requiring EA surface treatment, or the like. The material requiring EA surface treatment may be, for example, Group III-V semiconductor materials or Group II-VI semiconductor materials. Specifically, the material may be AlN, $Ce_2Te$, GaN, a compound of one or more types of alkaline metals and Sb, or AlAs, GaP, GaAs, GaSb, InAs, or the like, and a mixed crystal thereof, or the like. The material may be a metal as another example and specifically may be Mg, Cu, Nb, $LaB_6$, $SeB_6$, Ag, or the like. The photocathode 3 can be fabricated by applying EA surface treatment on the photocathode material described above. For the photocathode 3, suitable selection of the semiconductor material or the structure thereof makes it possible not only to select excitation light in a range from near-ultraviolet to infrared wavelengths in accordance with gap energy of the semiconductor but also to achieve electron beam source performance (quantum yield, durability, monochromaticity, time response, spin polarization) suitable for respective uses of the electron beam B.

Further, the material not requiring EA surface treatment may be, for example, a single metal, an alloy, or a metal compound of Cu, Mg, Sm, Tb, Y, or the like or diamond, WBaO, $Cs_2Te$, or the like. The photocathode not requiring EA surface treatment can be fabricated by a known method (for example, see Japanese Patent No. 3537779 or the like). The content disclosed in Japanese Patent No. 3537779 is incorporated in the present specification in its entirety by reference.

The anode 4 is not particularly limited as long as it can generate an electric field together with the cathode 3, and an anode generally used in the field of electron guns can be used.

In the example illustrated in FIG. 1, the photocathode 3 and the anode 4 are arranged inside the vacuum chamber CB. Note that, regarding the reference to "photocathode" and "cathode" in the present specification, "photocathode" may be used when the reference in question means emission of the electron beam B, and "cathode" may be used when the reference in question means the counter electrode of an "anode". Regarding the reference numeral, however, "3" is used for both cases of "photocathode" and "cathode".

The arrangement of a power supply is not particularly limited as long as the electron beam B can be emitted from the cathode 3 to the anode 4. In the example illustrated in FIG. 1, the power supply is arranged so that a potential difference occurs between the cathode 3 and the anode 4, and thereby an electric field can be generated.

The motion device 5 moves the excitation light L irradiating the photocathode 3. In the photocathode 3, continued irradiation with the excitation light L deteriorates electron emission characteristics, and the number of emitted electrons decreases. In the electron gun 1A according to the first embodiment, the excitation light L irradiating the photocathode 3 is moved by the motion device 5 to shift the irradiation position of the excitation light L to a new location. Since such a new location has not been deteriorated by the excitation light L, the lifetime of the photocathode 3 can be extended. The motion device 5 is not particularly limited as long as it can move the irradiation position of the excitation light L irradiating the photocathode 3.

In the example illustrated in FIG. 1, the motion device 5 includes a mirror 51 and a drive mechanism (not illustrated) configured to change the orientation of the mirror 51. The mirror 51 reflects the excitation light L emitted from the light source 2 to irradiate the photocathode 3 therewith. The mirror 51 may be any mirror that can reflect the excitation light L emitted from the light source 2, and other than general mirrors, a Galvano mirror, a digital mirror device (DMD), or the like may also be used. The drive mechanism is driven to change the orientation of the mirror 51 and thus change the orientation of the reflection of the excitation light L and thereby move the irradiation position of the excitation light L on the photocathode 3. The drive mechanism to change the orientation of the mirror 51 may be automatically driven or may be manually driven. When the drive mechanism is automatically driven, motive power generated by using a motive power source such as a piezo element, an electromagnetic coil, a DC or AC motor, a stepping motor, a servo motor, or the like, for example, may be transmitted directly to the mirror 51 to change the orientation of the mirror 51. Further, the motive power from the motive power source described above may be transmitted to the mirror 51 via a transmission mechanism such as a shaft, a gear mechanism, a screw mechanism, a link mechanism, a crank mechanism, a joint mechanism such as a universal joint, or the like to change the orientation of the mirror 51. When the drive mechanism is manually driven, a mechanism with a hand-turned wheel may be employed, for example. Note that, although the excitation light L is moved in the X direction by a change of the orientation of the mirror 51 in the example illustrated in FIG. 1, the orientation of the mirror 51 may be changed so that the excitation light L can be further moved in the Y direction. This makes it possible to move the irradiation position of the excitation light L in the X-Y plane.

The control unit 6 controls the irradiation position of the excitation light L that is moved by the motion device 5. The photocathode 3 may be deteriorated by irradiation with the excitation light L. Thus, the irradiation position of the excitation light L on the photocathode 3 is moved by the motion device 5 to irradiate a new position with the excitation light L. As will be described later with Examples, the inventors have found that the photocathode 3 was also deteriorated at positions other than an irradiated position irradiated with the excitation light L. Further, it has been found that the degree of deterioration of the photocathode 3 is higher at a position closer to an irradiated position of the excitation light L, gradually decreases as the position is more distant from said irradiated position, and depends on the distance from the irradiation position of the excitation light L. It is thus preferable to move the irradiation position of the excitation light L to a position outside a range of a higher degree of deterioration at an irradiated position of the excitation light L and near said irradiated position (hereafter, also referred to as "excitation light irradiation-caused deteriorated range"). The excitation light irradiation-caused deteriorated range changes in accordance with irradiation time at the irradiation position of the excitation light L and ranges about five times the spot diameter. Therefore, the excitation light irradiation-caused deteriorated range is a range defined by a circle having a diameter of five times the spot diameter d at the irradiation position R of the excitation light L, that is, the range inside the dashed line, as illustrated in FIG. 2A. Accordingly, the control unit 6 controls the motion device 5 to move the irradiation position of the excitation light L to a position outside the excitation light irradiation-caused deteriorated range associated with the irradiation position of the excitation light L, that is, to a position less affected by the deterioration due to irradiation with the excitation light L and thereby extend the lifetime of the photocathode 3. Note that, in the example illustrated in FIG. 2, the spot at the irradiation position of the excitation light L is a circle. Alternatively, the spot may have an oval shape such as an elliptical shape, an oval, or an ellipse (hereafter, a shape other than a circle may be referred to as "non-circle"). In the present specification, when the spot at the irradiation position of the excitation light L is a circle, the reference to "spot diameter of excitation light" means the diameter of the circle, and when the spot at the irradiation position of the excitation light L is a non-circle, the reference to "spot diameter of excitation light" means the diameter of a circle circumscribing the non-circle.

The control of the motion device 5 performed by the control unit 6 is not particularly limited as long as the irradiation position of the excitation light L is moved to a position outside the excitation light irradiation-caused deteriorated range. In the example illustrated in FIG. 2A, the excitation light irradiation-caused deteriorated range associated with the position R is a circular range of the dashed line having a diameter of five times the spot diameter d of the excitation light L. Thus, the position to which the excitation light L is moved can be any position outside the dashed line circle having the diameter of five times the spot diameter d at the irradiation position of the excitation light L. In other words, as illustrated in FIG. 2B, the center of the spot at the irradiation position of the excitation light L after moved can be any position that is distant by at least three or more times the spot diameter from the center of the spot at the irradiation position before moved. The center of the spot at the irradiation position of the excitation light L after moved may be, for example, a position that is distant by 3 times, 4 times, 5 times, 6 times, 7 times, 8 times, 9 times, 10 times, 11 times, 12 times, 13 times, 14 times, 15 times, 16 times, 17 times, 18 times, 19 times, or 20 times the spot diameter d from the center of the spot associated with the position R of the excitation light L. Further, since the spot diameter at the irradiation position of the excitation light L is small, the distance to move the irradiation position of the excitation light L is also small. Thus, even when the excitation light L is moved, displacement of the optical axis of the electron beam B emitted from the photocathode 3 is small. Therefore, in the electron gun 1A according to the first embodiment, it is not required to adjust the optical axis of the electron beam B even when the irradiation position of the excitation light L is moved.

The irradiation position of the excitation light L is moved in a range where the electron beam B can be emitted from the photocathode 3 and desired output can be obtained in a counterpart device E in which the electron gun 1A according to the embodiment is installed. The range where desired output can be obtained is a range where an image of a sample can be captured when the counterpart device E is an electron microscope, for example. The range where desired output can be obtained in the counterpart device E varies in accordance with the specification of the electron gun 1A or the counterpart device E, for example, configurations such as a configuration with or without a lens, a diameter of an aperture, and the like. Therefore, the range where the irradiation position of the excitation light L is moved can be adjusted as appropriate within a range where desired output can be obtained in the counterpart device E in accordance with the specifications of the electron gun 1A and the counterpart device E. When a position on the photocathode 3 overlapping the optical axis of the counterpart device E with respect to the optical axis of the counterpart device E as a reference is defined as the center of the excitation light irradiation on the photocathode 3, the range where desired output can be obtained may be, but is not limited to, inside a circle having a radius of 70 μm about the center of the excitation light irradiation, for example. Further, the spot diameter of the excitation light L irradiating the photocathode 3 in general is a few micrometers. Thus, for example, when the spot diameter of the excitation light L irradiating the photocathode 3 is 2 μm, the range where desired output can be obtained is within a distance of 35 times a converted spot diameter about the center of the excitation light irradiation. Therefore, the range where the irradiation position of the excitation light L is moved may be within 35 times, within 34 times, within 33 times, within 32 times, within 31 times, within 30 times, within 29 times, within 28 times, within 27 times, within 26 times, within 25 times, within 24 times, within 23 times, within 22 times, within 21 times, or within 20 times the spot diameter d from the center of the excitation light irradiation. The examples of the range where the irradiation position of the excitation light L is moved as described above is a range expanding from the center of the excitation light irradiation. Therefore, when the irradiation position of excitation light is a position distant by about 35 times the spot diameter from the center of excitation light irradiation, in other words, is at the outermost of the range where desired output can be obtained, the excitation light can be moved to the opposite side in the range where the desired output can be obtained with respect to the center of the excitation light irradiation as the center of symmetry.

The control of the motion device 5 performed by the control unit 6 may move the irradiation position of the excitation light L multiple times. With multiple times of motion of the irradiation position of the excitation light L, the lifetime of the photocathode 3 can be extended for the number of times of motion. Multiple times of motion of the excitation light L are performed as illustrated in FIG. 2B, for example. In the example illustrated in FIG. 2B, the position $R_n$ (n is a natural number) on the photocathode 3 is irradiated with the excitation light L. After the irradiation with the excitation light L at the position $R_n$, the irradiation position of the excitation light L is moved out of the excitation light irradiation-caused deteriorated range associated with the position $R_n$. Specifically, the excitation light L is moved so that the center of the spot comes to the position $R_{n+1}$ that is distant by 3d, which is three times the spot diameter d of the excitation light L, from the center of the spot at the position $R_n$. The excitation light L is then moved so that the center of the spot comes to the position $R_{n+2}$ that is distant by 3d from the center of the spot at the position $R_{n+1}$. Note that a position $R_{n-1}$ was the irradiation position of the excitation light L before the irradiation of the position $R_n$.

Further, the motion of the excitation light L, for example, the motion from the position $R_n$ to the position $R_{n+1}$ in FIG. 2B may be performed at any timing. The irradiation position of the excitation light L may be moved to the position $R_{n+1}$ at a timing that the quantum efficiency of the photocathode 3 at the position $R_n$ decreases to a defined threshold or lower because of deterioration of the photocathode 3 due to irradiation with the excitation light L at the position $R_n$, or the irradiation position of the excitation light L may be moved to the position $R_{n+1}$ at a timing that the quantum efficiency is higher than the defined threshold. Note that the threshold of the quantum efficiency can be set as appropriate so that a desired electron beam B is emitted. When the excitation light L is moved at a timing that the quantum efficiency decreases to the defined threshold or lower, the position on the photocathode 3, which was irradiated with the excitation light L before the irradiation of the position $R_n$, and the area near said irradiated position have been deteriorated due to the irradiation with the excitation light L (the excitation light irradiation-caused deteriorated range). It is thus preferable that the position $R_{n+1}$ to which the excitation light L is moved be a position outside the excitation light irradiation-caused deteriorated range associated with the position irradiated with the excitation light L before the irradiation of the position $R_n$. Further, when the excitation light L is moved at a timing that the quantum efficiency is larger than the defined threshold, deterioration has less progressed at the position irradiated with the excitation light L before the irradiation of the position $R_n$. Thus, the position $R_{n+1}$ to which the excitation light L is moved may be the position, which was irradiated with the excitation light L before the irradiation of the position $R_n$, and an area near said irradiated position or may be a position outside the position, which was irradiated with the excitation light L before the irradiation of the position $R_n$, and the area near said irradiated position. Note that, to reduce the impact of deterioration due to irradiation with the excitation light L regardless of the timing of motion of the excitation light L, the excitation light L may be moved so that the center of the spot always comes to the position Roti that is distant by 3d, which is three times the spot diameter d of the excitation light L, from the center of the spot at the position $R_n$.

Further, while "the excitation light irradiation-caused deteriorated range" is a range where the degree of deterioration due to irradiation with the excitation light L is large as described above, the expression of "the excitation light irradiation-caused deteriorated range" may also be used when deterioration due to irradiation with the excitation light L has not progressed in the present specification. In such a case, "the excitation light irradiation-caused deteriorated range" is the same as a range where the degree of deterioration at the irradiation position of the excitation light L is large. In other words, the range is about five times the spot diameter of the excitation light L on the photocathode 3, that is, the range inside the dashed line in FIG. 2, for example.

Second Embodiment of Electron Gun

Figure 3:
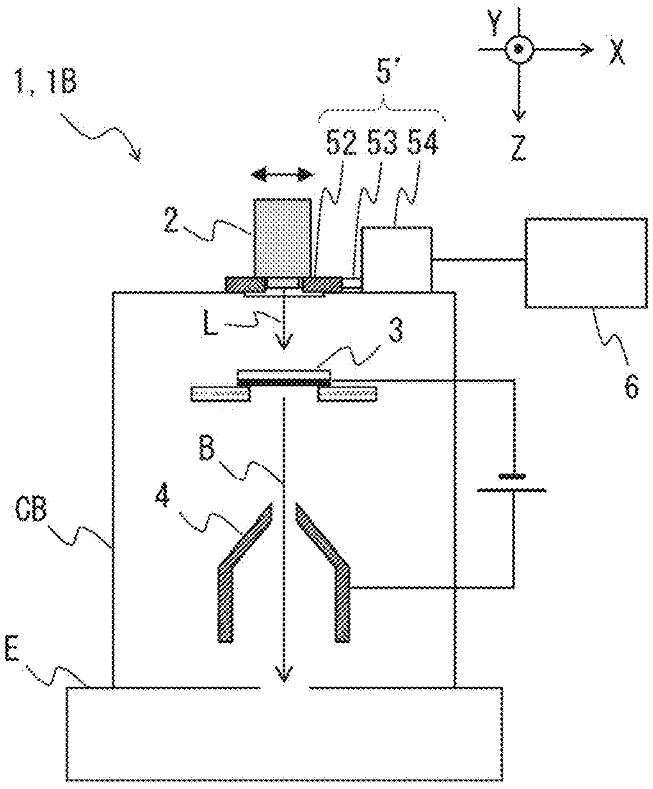
FIG. 3 is a diagram schematically illustrating an example of an electron gun 1B according to a second embodiment when viewed from the Y direction.

An electron gun 1B according to the second embodiment will be described with reference to FIG. 3. FIG. 3 is a diagram schematically illustrating an example of the electron gun 1B according to the second embodiment when viewed from the Y direction.

The electron gun 1B according to the second embodiment differs from the electron gun 1A according to the first embodiment in that the photocathode 3 is directly irradiated with the excitation light L from the light source 2 and that the light source 2 is moved by the motion device 5', and other features are the same as those in the electron gun 1A. Therefore, for the electron gun 1B according to the second embodiment, features different from those in the first embodiment will be mainly described, and duplicated description for the features that have already been described in the first embodiment will be omitted. Accordingly, it is apparent that, even when not explicitly described in the second embodiment, any feature that has already been described in the first embodiment can be employed in the second embodiment.

As illustrated in FIG. 3, the electron gun 1B according to the second embodiment directly irradiates the photocathode 3 with the excitation light L emitted from the light source 2. Further, the electron gun 1B according to the second embodiment includes the motion device 5' that moves the light source 2.

The motion device 5' is not particularly limited as long as it can move the light source 2. In the example illustrated in FIG. 3, the motion device 5' includes a stage 52, a motive power transmission mechanism 53, and a drive source 54.

The light source 2 is placed on the stage 52. The stage 52 is not particularly limited as long as it can place the light source 2 thereon and does not obstruct irradiation of the photocathode 3 with the excitation light L emitted from the light source 2, and a known stage can be used.

The motive power transmission mechanism 53 transmits motive power generated by the drive source 54 to the stage 52. The motive power transmission mechanism 53 is not particularly limited as long as it can transmit the motive power to the stage 52. The motive power transmission mechanism 53 may be, for example, a shaft, a gear mechanism, a screw mechanism, a link mechanism, a crank mechanism, or a joint mechanism such as a universal joint.

The drive source 54 generates motive power that moves the stage 52. The motive power is not particularly limited as long as it can move the stage 52 via the motive power transmission mechanism 53. The motive power may be automatically generated by the drive source 54 or manually generated by the drive source 54. The same drive source as that included in the motion device 5 in the electron gun 1A according to the first embodiment described above can be used as a drive source to automatically generate motive power. Further, a drive source to manually generate motive power may be a drive source with a screw mechanism, for example.

Note that, although the light source 2 is moved in the X direction in the example illustrated in FIG. 3, a motion device for moving the light source 2 in the Y direction may be further provided. When a motion device to move the light source 2 in the Y direction is provided, the light source 2 can be moved in the X-Y plane. Further, alternatively, with respect to the motion device 5', the light source 2 may be moved in the X-Y plane by a single motion device 5'. For example, a gear or the like may be provided to a motive power transmission mechanism, and the stage may be switched and moved in the X direction or the Y direction.

First Embodiment of Irradiation Position Moving Method

The first embodiment of the irradiation position moving method for moving the irradiation position of the excitation light L irradiating the photocathode 3 by using the electron gun 1A or the electron gun 1B will be described.

The irradiation position moving method according to the first embodiment includes an irradiation step of irradiating the position $R_n$ (n is a natural number) on the photocathode 3 with the excitation light L and a motion step of moving the irradiation position of the excitation light L from the position $R_n$ to the position $R_{n+1}$.

The irradiation step irradiates any position $R_n$ on the photocathode 3 with the excitation light L. In response to irradiation at the position $R_n$ on the photocathode 3 with the excitation light L from the light source 2, the electron beam B is emitted from the photocathode 3.

The motion step is to move the irradiation position of the excitation light L irradiating the position $R_n$ on the photocathode 3 to the position $R_{n+1}$. In this step, the position $R_{n+1}$ can be any position outside the excitation light irradiation-caused deteriorated range resulted from the irradiation of the position $R_n$ with the excitation light L, as described above. The position $R_{n+1}$ may be, for example, a position where the center of the spot of the moved excitation light L comes, which is a position distant by three or more times the spot diameter d from the center of the spot at the position $R_n$ of the excitation light L, and this position may be a position distant from the same by 3 times, 4 times, 5 times, 6 times, 7 times, 8 times, 9 times, 10 times, 11 times, 12 times, 13 times, 14 times, 15 times, 16 times, 17 times, 18 times, 19 times, or 20 times the spot diameter d.

Further, the excitation light L to the position $R_{n+1}$ in the motion step is moved within a range where the electron beam B can be emitted from the photocathode 3 and desired output can be obtained in the counterpart device E in which the electron gun 1A is installed, as described above.

The timing to move the irradiation position of the excitation light L from the position $R_n$ to the position $R_{n+1}$ in the motion step is not particularly limited. The irradiation position of the excitation light L may be moved to the position $R_{n+1}$ at a timing that the quantum efficiency of the photocathode 3 at the position $R_n$ decreases to a defined threshold or lower because of deterioration of the photocathode 3 due to irradiation with the excitation light L at the position $R_n$, or the irradiation position of the excitation light L may be moved to the position $R_{n+1}$ at a timing that the quantum efficiency is higher than the defined threshold. When the irradiation position of the excitation light L is moved to the position $R_{n+1}$ at a timing that the quantum efficiency decreases to the defined threshold or lower, it is preferable that the position $R_{n+1}$ to which the excitation light L is moved be a position outside the excitation light irradiation-caused deteriorated range associated with the position irradiated with the excitation light L before the irradiation of the position $R_n$, as described above. Further, when the excitation light L is moved at a timing that the quantum efficiency is larger than the defined threshold, the position $R_{n+1}$ to which the excitation light L is moved may be a position included in the excitation light irradiation-caused deteriorated range or may be a position outside the excitation light irradiation-caused deteriorated range associated with the position irradiated with the excitation light L before the irradiation of the position $R_n$, as described above.

The electron gun 1A according to the first embodiment, the electron gun 1B according to the second embodiment, and the irradiation position moving method according to the first embodiment achieve the following advantageous effects.

(1) Since it is not required to provide any device that moves the irradiation position of the excitation light L to inside of the vacuum chamber CB, it is possible to reduce the size of the electron gun and eliminate a risk of a failure inside the vacuum chamber CB. Further, since no device that moves the irradiation position of the excitation light L is included inside the vacuum chamber CB, there is neither gas generation due to motion nor contamination inside the vacuum chamber CB.

(2) Since the excitation light L is moved to a position less affected by deterioration of the photocathode 3 due to irradiation with the excitation light L, it is possible to utilize a position on the photocathode 3 having a higher quantum efficiency than the position $R_n$ on the photocathode 3.

(3) Since the distance to move the irradiation position of the excitation light L is small, there is no need to include a correction device that performs correction to match the optical axis of the electron beam B emitted from the photocathode 3 with the optical axis of the counterpart device E.

Third Embodiment of Electron Gun

Figure 4:
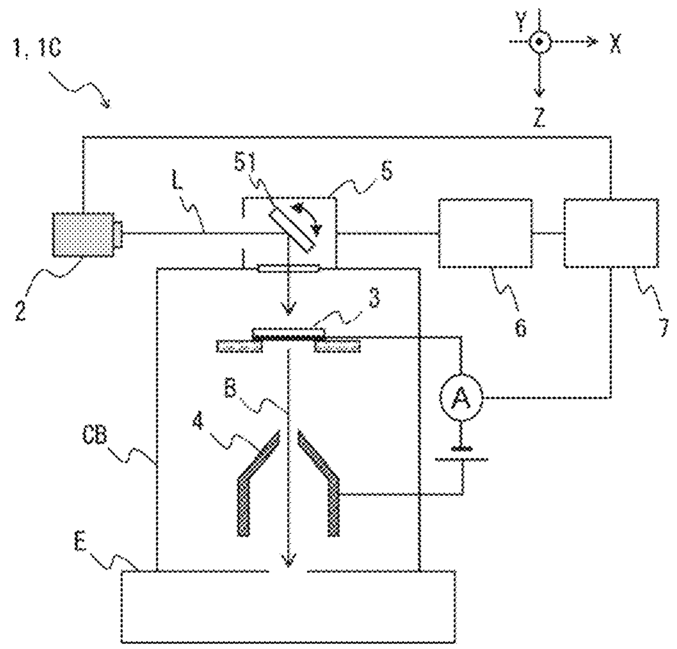
FIG. 4 is a diagram schematically illustrating an example of an electron gun 1C according to a third embodiment when viewed from the Y direction.

An electron gun 1C according to the third embodiment will be described with reference to FIG. 4. FIG. 4 is a diagram schematically illustrating an example of the electron gun 1C according to the third embodiment when viewed from the Y direction.

The electron gun 1C according to the third embodiment differs from the electron gun 1A according to the first embodiment in that a calculation unit 7 to calculate the quantum efficiency of the photocathode at an irradiation position of the excitation light L is provided and, based on a calculation result from the calculation unit 7, the control unit 6 controls motion of the irradiation position of the excitation light L, and other features are the same as those in the electron gun 1A. Therefore, for the electron gun 1C according to the third embodiment, features different from those in the first embodiment will be mainly described, and duplicated description for the features that have already been described in the first embodiment will be omitted. Accordingly, it is apparent that, even when not explicitly described in the third embodiment, any feature that has already been described in the first embodiment can be employed in the third embodiment.

The electron gun 1C according to the third embodiment includes the calculation unit 7. The calculation unit 7 calculates the quantum efficiency of the photocathode at an irradiation position of the excitation light L. Herein, the quantum efficiency can be found by Equation (1) below.

[Math. 1]

$$Q = \frac{n_e}{n_p} \tag{1}$$

In Equation (1), Q denotes quantum efficiency, ne denotes the number of emitted electrons per unit time, and np denotes the number of incident photons per unit time. Further, ne and np can be modified into Equation (2) below, respectively.

[Math. 2]

$$n_e = \frac{I}{e}\ n_p = \frac{Pf\lambda}{hc} \tag{2}$$

In Equation (2), I denotes a value of current, e denotes an elementary charge of an electron, P denotes a light intensity, f denotes a light transmittance, A denotes an incident light wavelength, h denotes the Planck constant, and c denotes the velocity of light.

Therefore, with measurement of the value of current I and the light intensity P, the quantum efficiency can be calculated. In the example illustrated in FIG. 4, the calculation unit 7 acquires the value of current between the cathode 3 and the anode 4 and the light intensity value from the light source 2 and calculates the quantum efficiency of the photocathode at an irradiation position of the excitation light L.

Note that, in the example illustrated in FIG. 4, the value of current is measured by an ammeter arranged between the cathode 3 and the anode 4. Alternatively, an electron beam shielding member having a hole whose diameter is smaller than the beam diameter of the electron beam B may be arranged between the anode 4 inside the vacuum chamber CB and the counterpart device E, and the value of current may be measured by the electron beam B blocked by the electron beam shielding member. Measurement of the value of current using an electron beam shielding member is disclosed in more detail in Japanese Patent No. 6578529, and the content disclosed in Japanese Patent No. 6578529 is incorporated in the present specification.

The control unit 6 controls the motion device 5 based on the calculation result calculated by the calculation unit 7, that is, the quantum efficiency of the photocathode at an irradiation position of the excitation light L. For example, the control unit 6 may control the motion device 5 to move the irradiation position of the excitation light L from the position $R_n$ to the position Rati at a timing that the value of quantum efficiency calculated by the calculation unit 7 decreases to a defined threshold or lower. Alternatively, the control unit 6 may control the motion device 5 to move the irradiation position of the excitation light L from the position $R_n$ to the position $R_{n+1}$ at a timing that the value of quantum efficiency is higher than the defined threshold. When the motion device 5 is controlled to move the irradiation position of the excitation light L from the position $R_n$ to the position $R_{n+1}$ at a timing that the quantum efficiency decreases to the defined threshold or lower, the excitation light irradiation-caused deteriorated range associated with the position on the photocathode 3 irradiated with the excitation light L before the irradiation of the position $R_n$ has been deteriorated due to the irradiation with the excitation light L. It is thus preferable that the position $R_{n+1}$ to which the excitation light L is moved be a position outside the excitation light irradiation-caused deteriorated range associated with the position irradiated with the excitation light L before the irradiation of the position $R_n$. Further, when the motion device 5 is controlled to move the irradiation position of the excitation light L from the position $R_n$ to the position $R_{n+1}$ at a timing that the quantum efficiency is larger than the defined threshold, deterioration has less progressed at the position irradiated with the excitation light L before the irradiation of the position $R_n$. Thus, the position $R_{n+1}$ to which the excitation light L is moved may be a position included in the excitation light irradiation-caused deteriorated range or may be a position outside the excitation light irradiation-caused deteriorated range associated with the position irradiated with the excitation light L before the irradiation of the position $R_n$.

Second Embodiment of Irradiation Position Moving Method

The second embodiment of the irradiation position moving method for moving the irradiation position of the excitation light L irradiating the photocathode 3 by using the electron gun 1C will be described.

The irradiation position moving method according to the second embodiment differs from the irradiation position moving method according to the first embodiment in that a calculation step for calculating the quantum efficiency of the photocathode an at irradiation position of the excitation light L is included between the irradiation step and the motion step and the motion step is performed based on the calculation result provided by the calculation step, and other features are the same as those in the irradiation position moving method according to the first embodiment. Therefore, for the irradiation position moving method according to the second embodiment, features different from those in the first embodiment will be mainly described, and duplicated description for the features that have already been described in the first embodiment will be omitted. Accordingly, it is apparent that, even when not explicitly described in the second embodiment, any feature that has already been described in the second embodiment can be employed in the second embodiment.

The calculation step is to calculate the quantum efficiency of the photocathode at irradiation position of the excitation light L. As described with the electron gun 1C according to the third embodiment, the quantum efficiency is calculated from the value of current between the cathode 3 and the anode 4 and the intensity of light from the light source 2.

The irradiation position moving method according to the second embodiment performs the motion step based on a calculation result calculated in the calculation step, that is, on the quantum efficiency of the photocathode at an irradiation position of the excitation light L. The motion from the position $R_n$ to the position $R_{n+1}$ in the motion step may be performed at a timing that the value of quantum efficiency decreases to a defined threshold or lower or may be performed at a timing that the value of quantum efficiency is higher than the defined threshold in the calculation step, for example. When the motion step is performed at a timing that the quantum efficiency decreases to the defined threshold or lower, it is preferable that the position $R_{n+1}$ to which the excitation light L is moved be a position outside the excitation light irradiation-caused deteriorated range associated with the position irradiated with the excitation light L before the irradiation of the position $R_n$, as described above. Further, when the motion step is performed at a timing that the quantum efficiency is larger than the defined threshold, the position Rani to which the excitation light L is moved may be a position included in the excitation light irradiation-caused deteriorated range or may be a position outside the excitation light irradiation-caused deteriorated range associated with the position irradiated with the excitation light L before the irradiation of the position $R_n$, as described above.

The electron gun 1C according to the third embodiment and the irradiation position moving method according to the second embodiment achieve the following advantageous effects synergistically in addition to the advantageous effects achieved by the electron guns 1A and 1B and the irradiation position moving method according to the embodiments described above.

(1) The irradiation position of the excitation light L can be moved from the position $R_n$ to the position $R_{n+1}$ based on quantum efficiency that is a calculation result. Therefore, since motion of the irradiation position can be efficiently performed, the lifetime of the photocathode 3 can be extended.

(2) When motion from the position $R_n$ to the position $R_{n+1}$ is performed at a timing that the quantum efficiency decreases to a threshold or lower, irradiation with the excitation light L can be continued until the quantum efficiency decreases to the threshold or lower. Since the irradiation position of the excitation light L is moved infrequently during emission of the electron beam B, the frequency that displacement of the optical axis occurs due to the motion of said irradiation position can be reduced.

Fourth Embodiment of Electron Gun

Figure 5:
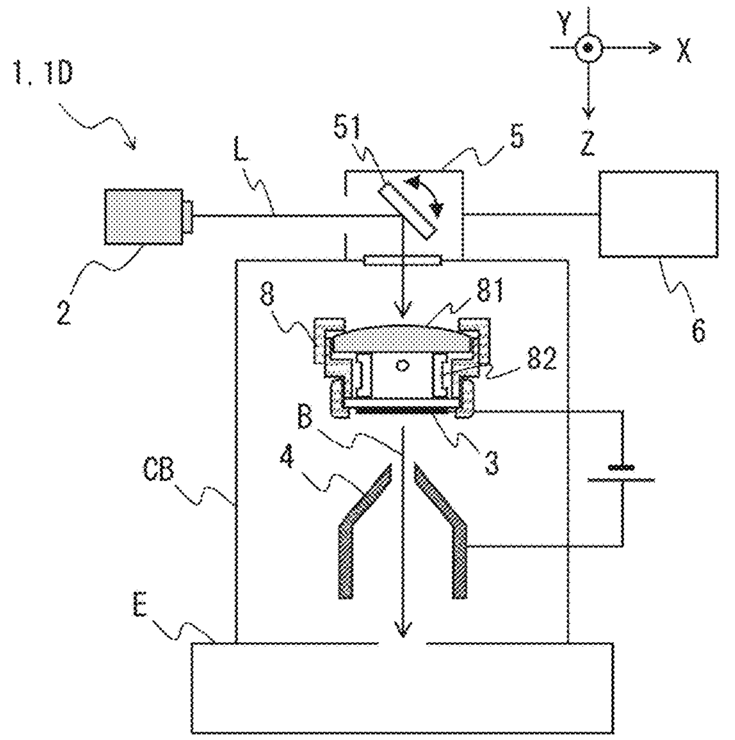
FIG. 5 is a diagram schematically illustrating an example of an electron gun 1D according to a fourth embodiment when viewed from the Y direction.

An electron gun 1D according to the fourth embodiment will be described with reference to FIG. 5. FIG. 5 is a diagram schematically illustrating an example of the electron gun 1D according to the fourth embodiment when viewed from the Y direction.

The electron gun 1D according to the fourth embodiment differs from the electron gun 1A according to the first embodiment in that a photocathode holder 8 including a lens 81 is further provided, and other features are the same as those in the electron gun 1A. Therefore, for the electron gun 1D according to the fourth embodiment, features different from those in the first embodiment will be mainly described, and duplicated description for the features that have already been described in the first embodiment will be omitted. Accordingly, it is apparent that, even when not explicitly described in the fourth embodiment, any feature that has already been described in the first embodiment can be employed in the fourth embodiment.

Irradiation of the photocathode 3 with the excitation light L in the electron gun 1 may be performed via the lens 81. The lens 81 converges the excitation light L from the light source 2 onto the photocathode 3. The converged excitation light L is focused on the photocathode 3, and the electron beam B is emitted from the photocathode 3. Thus, installation of the photocathode 3 to the electron gun 1 typically requires position adjustment with respect to the lens 81.

The electron gun 1D according to the fourth embodiment includes the photocathode holder 8 including the lens 81. The lens 81 is held by the photocathode holder 8 at a position where the lens 81 focuses light on the photocathode 3. The example illustrated in FIG. 5 represents an example in which a spacer 82 is provided between the photocathode 3 and the lens 81. Further, the photocathode 3 is formed of a substrate and a photocathode film, as described above. Thus, in the present specification, when it is stated that the photocathode holder 8 holds the photocathode 3, this includes that the photocathode holder 8 holds both the substrate and the photocathode film of the photocathode 3 together and that the photocathode holder 8 holds only the substrate of the photocathode 3. Note that details of the photocathode holder 8 are disclosed in more detail in Japanese Patent No. 6679014, and the features disclosed in Japanese Patent No. 6679014 are incorporated in the present specification.

Therefore, with the photocathode holder 8 being arranged on the optical path of the excitation light L, the focus of the lens 81 can be always set on the photocathode 3 without position adjustment between the photocathode 3 and the lens 81.

Further, the focus of the lens 81 is set on the photocathode 3 by the photocathode holder 8. Thus, since the distance to move the excitation light L is small even when the irradiation position of the excitation light L is moved, the influence of displacement due to the motion can be ignored, and the electron beam B can be emitted from the photocathode 3.

Third Embodiment of Irradiation Position Moving Method

The third embodiment of the irradiation position moving method for moving the irradiation position of the excitation light L irradiating the photocathode 3 by using the electron gun 1D will be described.

The irradiation position moving method according to the third embodiment differs from the irradiation position moving method according to the first embodiment in that the photocathode 3 is irradiated with the excitation light L via the lens 81 included in the photocathode holder 8 in the irradiation step, and other features are the same as those in the irradiation position moving method according to the first embodiment. Therefore, for the irradiation position moving method according to the third embodiment, features different from those in the first embodiment will be mainly described, and duplicated description for the features that have already been described in the first embodiment will be omitted. Accordingly, it is apparent that, even when not explicitly described in the third embodiment, any feature that has already been described in the third embodiment can be employed in the third embodiment.

In the irradiation step in the irradiation position moving method according to the third embodiment, the photocathode 3 is irradiated with the excitation light L via the lens 81 included in the photocathode holder 8. Thus, the focus of the lens 81 is always set on the photocathode 3 without position adjustment between the photocathode 3 and the lens 81, as described above. Further, even when the irradiation position of the excitation light L is moved, the influence of displacement due to the motion can be ignored, and the electron beam B can be emitted from the photocathode 3.

The electron gun 1D according to the fourth embodiment and the irradiation position moving method according to the third embodiment achieve the following advantageous effects synergistically in addition to the advantageous effects achieved by the electron guns 1A to 1C and the irradiation position moving methods according to the embodiments described above.

(1) Since the photocathode holder 8 including the lens 81 is provided, even when the irradiation position of the excitation light L is moved from the position $R_n$ to the position $R_{n+1}$, the influence of displacement can be ignored, and the electron beam B can be emitted.

(2) Since the excitation light L is converged onto the photocathode 3 by the lens 81, the spot diameter of the excitation light on the photocathode 3 can be reduced.

(3) Since the excitation light L is converged onto the photocathode 3 by the lens 81, the motion distance of the excitation light L on the photocathode is smaller relative to the motion distance of the excitation light L that has not passed through the lens 81. Therefore, the motion of the irradiation position of the excitation light L by the motion device 5 can be precisely controlled.

Embodiment of Electron Beam Applicator

The counterpart device E on which each of the electron guns 1A to 1D according to the embodiments described above is mounted may be a known device on which each of the electron guns 1A to 1D is mounted. For example, the counterpart device E may be a free electron laser accelerator, an electron microscope, an electron holography device, an electron beam drawing device, an electron diffractometer, an electron beam inspection device, an electron beam metal additive manufacturing device, an electron beam lithography device, an electron beam processing device, an electron beam curing device, an electron beam sterilization device, an electron beam disinfection device, a plasma generation device, an atomic element generation device, a spin-polarized electron beam generation device, a cathodoluminescence device, an inverse photoemission spectroscopy device, or the like.

Note that the present invention is not limited to the embodiments described above. Any combination of respective embodiments described above, modification of any component of respective embodiments, or omission of any component of respective embodiments is possible within the scope of the present invention. Furthermore, any component may be added to respective embodiments described above. For example, the electron gun 1 may include an optical fiber. The optical fiber guides the excitation light L from the light source 2 to the photocathode 3. At this time, by moving the position of the end of the optical fiber on the photocathode 3 side, it is possible to move the irradiation position of the excitation light L onto the photocathode 3.

EXAMPLES

Example 1

[Quantum Efficiency Distribution of a Photocathode when the Photocathode is Irradiated with Laser Light (Excitation Light) Until the Photocathode is Deteriorated]

The impact of irradiation with laser light on the quantum efficiency of the photocathode 3 observed near an irradiation position when the photocathode was irradiated with the laser light until the photocathode was deteriorated was examined.

A laser light source (iBeamSmart by Toptica) was used for the light source 2. For the photocathode 3, an InGaN photocathode 3 was fabricated by a known method described in Daiki SATO et al. 2016 Jpn. J. Appl. Phys. 55 05FH05. NEA treatment on the surface of the photocathode 3 was performed in accordance with a known method. Further, the photocathode 3 was held by the photocathode holder 8 including the lens 81 and arranged inside the vacuum chamber CB.

The procedure is illustrated below.

[1] The photocathode 3 was irradiated with laser light (laser spot diameter of 2 μm) from the light source 2 and an acceleration voltage of 25 kV was applied between the photocathode 3 and the anode 4 to emit the electron beam B from the photocathode 3.

[2] The current and the laser intensity were continuously measured during the emission of the electron beam B to calculate the quantum efficiency.

[3] After the quantum efficiency calculated in [2] described previously decreased to be less than $10^{-6}$, the motion device 5 including the mirror 51 was used to change the orientation of the mirror 51 and move the irradiation position of the laser light on the photocathode 3.

[4] The current and the laser intensity were measured at the moved irradiation position to calculate the quantum efficiency.

[5] After the calculation of the quantum efficiency illustrated previously in [4], the irradiation position of the laser light was quickly moved to the next position, and the quantum efficiency was calculated. Unlike [3] described above, since the irradiation time of the laser light was short, the photocathode 3 was not deteriorated.

[6] The procedure of [5] described previously was repeated, and a distribution of changes affecting the quantum efficiency of the photocathode 3 near said irradiated position when the photocathode was irradiated with the excitation light L until the photocathode 3 was deteriorated was examined.

Example 2

[Quantum Efficiency Distribution of a Photocathode when Laser Light is Moved Before the Photocathode is Deteriorated]

The distribution was examined in accordance with the same procedure as that in Example 1 except that, in [3] of Example 1, the irradiation position of the laser light was quickly moved, instead of the laser light being irradiated until the quantum efficiency decreased to be less than $10^{-6}$.

Figure 6:
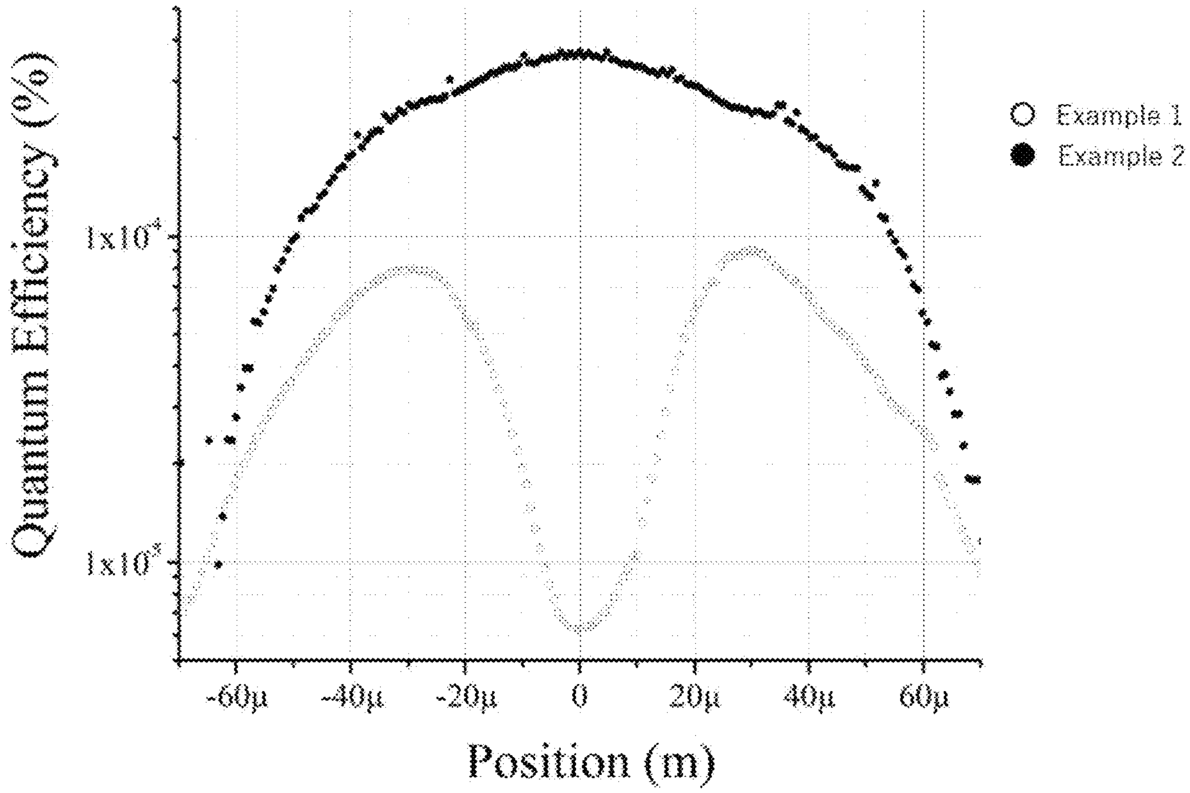
FIG. 6 is a diagram illustrating relationships between the irradiation position of the excitation light L and the quantum efficiency in Example 1 and Example 2.

FIG. 6 illustrates results of Example 1 and Example 2. The horizontal axis represents the distance in the X-axis direction on the photocathode 3, and 0 μm corresponds to a position irradiated with laser light that has passed through the center of the lens 81. The vertical axis represents the quantum efficiency.

In Example 1, the quantum efficiency was minimal at the position of 0 μm, increased as the position moved away from 0 μm, and was maximal at positions of +30 μm and −30 μm. The position at 0 μm corresponding to the minimal quantum efficiency was the most deteriorated. Further, the quantum efficiency increased as the position moved away from 0 μm. This indicates that the impact of deterioration due to irradiation with the laser light decreases in a distance-dependent manner (as the distance increases). It was indicated from the result of Example 1 that the impact of deterioration due to irradiation with the laser light is smaller at the position distant by 5 μm or longer from the position at 0 μm. Further, during the measurement, the photocathode 3 is held by the photocathode holder 8 including the lens 81 and irradiated with the laser light via the lens 81. The laser light is focused on the photocathode 3 by the lens 81 even when the laser light is moved. However, since the surface of the lens 81 is a curved surface, the laser light is affected by the curved surface at an area distant from the center of the lens 81, and this may result in a smaller intensity and a smaller value of current at the irradiation position of the laser light. It is therefore considered that the quantum efficiency is more affected and reduced by the curved surface of the lens 81 when the position is more distant from +30 μm or −30 μm with respect to 0 μm. However, the quantum efficiency at the positions more distant from +30 μm or −30 μm with respect to 0 μm was still higher than the minimal quantum efficiency at 0 μm, and desired output was also obtained in the counterpart device E without any problem.

It was indicated from the result of Example 1 that the impact of deterioration on the photocathode 3 is larger at a position irradiated with laser light and an area near the position due to irradiation with the laser light. It is therefore indicated that at least motion of the irradiation position of the laser light to a position of a smaller impact of deterioration results in a larger quantum efficiency and enables continued use of the photocathode 3.

In Example 2, the quantum efficiency was highest at the position of 0 μm. Further, the quantum efficiency decreased as the distance increased. This may be because the quantum efficiency is affected by the curved surface of the lens 81, as described above, while the photocathode 3 is not deteriorated. Note that the quantum efficiency in Example 2 was larger than that in Example 1 over the entire measurement range. The reason for the above may be that, in Example 1, since the photocathode 3 was deteriorated until the quantum efficiency decreased to be less than $10^{-6}$ at the irradiation position by irradiation with the laser light, the impact thereof deteriorated the overall photocathode 3, and the quantum efficiency was smaller in Example 1 over the entire measurement range.

It was indicated from the result of Example 2 that, since the photocathode 3 has not been deteriorated, the photocathode 3 can be used continuously even when the laser light is moved to any position. However, the longer the time of irradiation with the laser light is, the more the photocathode 3 is deteriorated. Thus, given the deterioration due to irradiation with the laser light, it is desirable to move the laser light to a position of a smaller impact of deterioration due to irradiation with the laser light to use the photocathode 3 even when the photocathode 3 has not been deteriorated to the threshold.

It was indicated from the above Examples that deterioration of the photocathode 3 due to irradiation with the laser light depends not only on an irradiation position of the laser light but also on the distance therefrom. Thus, when the irradiation position of the laser light is moved to extend the lifetime of the photocathode 3, it is desirable to perform control to move the laser light to a position of a smaller impact of deterioration.

INDUSTRIAL APPLICABILITY

The use of the electron gun, the electron beam applicator, and the irradiation position moving method disclosed in the present application can extend the lifetime of a photocathode without increasing the size of the electron gun and without a risk of a failure of a device inside the vacuum chamber. Therefore, the electron gun, the electron beam applicator, and the irradiation position moving method disclosed in the present application are useful for business entities that handle an electron gun.

LIST OF REFERENCES

1, 1A to 1D electron gun
2 light source
3 photocathode
4 anode
5, 5' motion device
51 mirror
52 stage
53 motive power transmission mechanism
54 drive source
6 control unit
7 calculation unit
8 photocathode holder
81 lens
82 spacer
B electron beam
CB vacuum chamber
d spot diameter
E counterpart device
L excitation light
R, $R_{n-1}$, $R_n$, $R_{n+1}$, $R_{n+2}$ irradiation position of excitation light

The invention claimed is:

1. An electron gun comprising:
a light source;
a photocathode that emits an electron beam in response to receiving light from the light source;
an anode;
a motion device including a driver and drive source, that moves excitation light irradiating the photocathode; and
a controller including a processor and a memory,
wherein the controller controls the motion device such that an irradiation position of the excitation light is moved from a position $R_n$ (n is a natural number) on the photocathode to a position $R_{n+1}$ outside an excitation light irradiation-caused deteriorated range associated with the position $R_n$, by execution of instructions stored in the memory by the processor,
wherein the excitation light irradiation-caused deteriorated range is a range where the photocathode is deteriorated due to irradiation with the excitation light, and
wherein the distance between the center of a spot of the excitation light at the position $R_n$ and the center of a spot of the excitation light at the position $R_{n+1}$ is at least three or more times a spot diameter of the excitation light on the photocathode, and,
wherein a movement range of the irradiation position of the excitation light is within a range in which adjustment of an optical axis of the electron beam emitted from the photocathode is not required.

2. The electron gun according to claim 1, wherein the processor calculates quantum efficiency of the photocathode at an irradiation position of the excitation light,
wherein the controller controls the motion device based on the calculated quantum efficiency.

3. The electron gun according to claim 2, wherein the position $R_{n+1}$ is a position outside the excitation light irradiation-caused deteriorated range associated with a position irradiated with the excitation light before irradiation of the position $R_n$.

4. The electron gun according to claim 2, wherein the position $R_{n+1}$ is a position included in the excitation light irradiation-caused deteriorated range associated with a position irradiated with the excitation light before irradiation of the position $R_n$.

5. The electron gun according to claim 2 further comprising a photocathode holder,
wherein the photocathode holder
holds the photocathode, and
includes a lens arranged spaced apart from the photocathode and configured to converge light from the light source onto the photocathode.

6. An electron beam applicator including the electron gun according to claim 2, wherein the electron beam applicator is:
a free electron laser accelerator,
an electron microscope,
an electron holography device,
an electron beam drawing device,
an electron diffractometer,
an electron beam inspection device,
an electron beam metal additive manufacturing device,
an electron beam lithography device, an electron beam processing device,
an electron beam curing device,
an electron beam sterilization device,
an electron beam disinfection device,
a plasma generation device,
an atomic element generation device,
a spin-polarized electron beam generation device,
a cathodoluminescence device, or
an inverse photoemission spectroscopy device.

7. The electron gun according to claim 1, wherein the position $R_{n+1}$ is a position outside the excitation light irradiation-caused deteriorated range associated with a position irradiated with the excitation light before irradiation of the position $R_n$.

8. An electron beam applicator including the electron gun according to claim 7, wherein the electron beam applicator is:
a free electron laser accelerator,
an electron microscope,
an electron holography device,
an electron beam drawing device,
an electron diffractometer,
an electron beam inspection device,
an electron beam metal additive manufacturing device,
an electron beam lithography device,
an electron beam processing device,
an electron beam curing device,
an electron beam sterilization device,
an electron beam disinfection device,
a plasma generation device,
an atomic element generation device,
a spin-polarized electron beam generation device,
a cathodoluminescence device, or
an inverse photoemission spectroscopy device.

9. The electron gun according to claim 1, wherein the position $R_{n+1}$ is a position included in the excitation light irradiation-caused deteriorated range associated with a position irradiated with the excitation light before irradiation of the position $R_n$.

10. An electron beam applicator including the electron gun according to claim 9, wherein the electron beam applicator is:
a free electron laser accelerator,
an electron microscope,
an electron holography device,
an electron beam drawing device,
an electron diffractometer,
an electron beam inspection device,
an electron beam metal additive manufacturing device,
an electron beam lithography device,
an electron beam processing device,
an electron beam curing device,
an electron beam sterilization device,
an electron beam disinfection device,
a plasma generation device,
an atomic element generation device,
a spin-polarized electron beam generation device,
a cathodoluminescence device, or
an inverse photoemission spectroscopy device.

11. The electron gun according claim 1 further comprising a photocathode holder,
wherein the photocathode holder
holds the photocathode, and
includes a lens arranged spaced apart from the photocathode and configured to converge light from the light source onto the photocathode.

12. An electron beam applicator including the electron gun according to claim 11, wherein the electron beam applicator is:
a free electron laser accelerator,
an electron microscope,
an electron holography device,
an electron beam drawing device,
an electron diffractometer,
an electron beam inspection device,
an electron beam metal additive manufacturing device,
an electron beam lithography device,
an electron beam processing device,
an electron beam curing device,
an electron beam sterilization device,
an electron beam disinfection device,
a plasma generation device,
an atomic element generation device,
a spin-polarized electron beam generation device,
a cathodoluminescence device, or
an inverse photoemission spectroscopy device.

13. An electron beam applicator including the electron gun according to claim 1, wherein the electron beam applicator is:
a free electron laser accelerator,
an electron microscope,
an electron holography device,
an electron beam drawing device,
an electron diffractometer,
an electron beam inspection device,
an electron beam metal additive manufacturing device,
an electron beam lithography device,
an electron beam processing device,
an electron beam curing device,
an electron beam sterilization device,
an electron beam disinfection device,
a plasma generation device,
an atomic element generation device,
a spin-polarized electron beam generation device,
a cathodoluminescence device, or
an inverse photoemission spectroscopy device.

14. An irradiation position moving method for moving an irradiation position of excitation light irradiating a photocathode in an electron gun including a light source and the photocathode, the irradiation position moving method comprising:
an irradiation step of irradiating a position $R_n$ (n is a natural number) on the photocathode with the excitation light; and
a motion step of moving an irradiation position of the excitation light from the position $R_n$ to a position $R_{n+1}$ outside an excitation light irradiation-caused deteriorated range associated with the position $R_n$,
wherein the excitation light irradiation-caused deteriorated range is a range where the photocathode is deteriorated due to irradiation with the excitation light,
wherein the distance between the center of a spot of the excitation light at the position $R_n$ and the center of a spot of the excitation light at the position $R_{n+1}$ is at least three or more times a spot diameter of the excitation light on the photocathode, and
wherein a moving range of the irradiation position of the excitation light in the moving step is within a range in which adjustment of an optical axis of the electron beam emitted from the photocathode is not required.

15. The irradiation position moving method according to claim 14 further comprising a calculation step of calculating quantum efficiency of the photocathode at an irradiation position of the excitation light between the irradiation step and the motion step, wherein the motion step is performed based on a calculation result provided by the calculation step.

16. The irradiation position moving method according to claim 15, wherein in the motion step, the position $R_{n+1}$ is a position outside the excitation light irradiation-caused deteriorated range associated with a position irradiated with the excitation light before irradiation of the position $R_n$.

17. The irradiation position moving method according to claim 15, wherein in the motion step, the position $R_{n+1}$ is a position included in the excitation light irradiation-caused deteriorated range associated with a position irradiated with the excitation light before irradiation of the position $R_n$.

18. The irradiation position moving method according to claim 14, wherein in the motion step, the position $R_{n+1}$ is a position outside the excitation light irradiation-caused deteriorated range associated with a position irradiated with the excitation light before irradiation of the position $R_n$.

19. The irradiation position moving method according to claim 14, wherein in the motion step, the position $R_{n+1}$ is a position included in the excitation light irradiation-caused deteriorated range associated with a position irradiated with the excitation light before irradiation of the position $R_n$.

* * * * *